(12) United States Patent
Jeong et al.

(10) Patent No.: US 9,812,618 B2
(45) Date of Patent: *Nov. 7, 2017

(54) EPOXY RESIN COMPOSITION AND LIGHT-EMITTING APPARATUS USING THE SAME

(71) Applicant: LG INNOTEK CO., LTD., Seoul (KR)

(72) Inventors: Jaehun Jeong, Seoul (KR); Sung Bae Moon, Seoul (KR); Sang In Yoon, Seoul (KR); Mi Jin Lee, Seoul (KR); Yuwon Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/768,108

(22) PCT Filed: Feb. 10, 2014

(86) PCT No.: PCT/KR2014/001091
§ 371 (c)(1),
(2) Date: Aug. 14, 2015

(87) PCT Pub. No.: WO2014/126366
PCT Pub. Date: Aug. 21, 2014

(65) Prior Publication Data
US 2016/0005937 A1    Jan. 7, 2016

(30) Foreign Application Priority Data
Feb. 14, 2013    (KR) ........................ 10-2013-0015831

(51) Int. Cl.
| | | |
|---|---|---|
| *C08L 83/04* | (2006.01) | |
| *H01L 33/00* | (2010.01) | |
| *H01L 33/56* | (2010.01) | |
| *C08L 63/06* | (2006.01) | |
| *C08G 59/32* | (2006.01) | |
| *C08G 59/30* | (2006.01) | |
| *H01L 33/54* | (2010.01) | |
| *H01L 33/62* | (2010.01) | |
| *F21K 9/20* | (2016.01) | |
| *C08K 5/3492* | (2006.01) | |
| *C08G 77/14* | (2006.01) | |

(52) U.S. Cl.
CPC ............ *H01L 33/56* (2013.01); *C08G 59/306* (2013.01); *C08G 59/3281* (2013.01); *C08K 5/34924* (2013.01); *C08K 5/34926* (2013.01); *C08L 63/06* (2013.01); *C08L 83/04* (2013.01); *F21K 9/20* (2016.08); *H01L 33/54* (2013.01); *H01L 33/62* (2013.01); *C08G 77/14* (2013.01); *C08L 2201/02* (2013.01); *H01L 2224/48091* (2013.01); *H01L 2224/48247* (2013.01)

(58) Field of Classification Search
None
See application file for complete search history.

(56) References Cited

U.S. PATENT DOCUMENTS

| | | | | |
|---|---|---|---|---|
| 3,779,988 | A | * | 12/1973 | Rembold et al. .... C08G 59/306 523/445 |
| 5,614,640 | A | | 3/1997 | Okawa |
| 9,048,402 | B2 | * | 6/2015 | Moon ..................... H01L 33/56 |
| 2010/0289055 | A1 | | 11/2010 | Tan et al. |
| 2011/0054072 | A1 | * | 3/2011 | Sawada et al. .... C08G 59/3236 523/353 |
| 2012/0172505 | A1 | | 7/2012 | Lin et al. |
| 2013/0320393 | A1 | * | 12/2013 | Moon ..................... H01L 33/56 257/100 |

FOREIGN PATENT DOCUMENTS

| | | |
|---|---|---|
| CN | 201210199417 A | 6/2010 |
| CN | 102791760 A | 11/2012 |
| CN | 103450633 A | 12/2013 |
| EP | 2186844 A1 | 11/2009 |
| JP | 2006-225515 A | 8/2006 |
| JP | 2009-094493 A | 4/2009 |
| JP | 2012077219 A | 4/2012 |
| JP | WO 2012/093589 A1 * | 7/2012 ........... H01L 23/293 |
| JP | 2012-184394 A * | 9/2012 |
| KR | 10-2009-0082868 A | 7/2009 |
| KR | 10-2011-0025112 A | 3/2011 |
| WO | WO-2012093589 A1 | 12/2012 |

OTHER PUBLICATIONS

International Search Report in International Application No. PCT/KR2014/001091, dated Feb. 10, 2014.
Office Action dated Jul. 19, 2016 in Chinese Application No. 2014800219746.

* cited by examiner

*Primary Examiner* — Ana Woodward
(74) *Attorney, Agent, or Firm* — Saliwanchik, Lloyd & Eisenschenk

(57) ABSTRACT

An epoxy resin composition provided according to one embodiment of the present invention includes: a triazine derivative epoxy compound; a siloxane compound including a cycloaliphatic epoxy group and a siloxane group; and a curing agent, where the epoxy resin composition includes 10 to 70 parts by weight of the siloxane group with respect to 100 parts by weight of the siloxane compound, thereby providing a composition excellent in heat resistance, light resistance, and excess moisture tolerance, with good shear adhesion to silicone, and capable of semi-solidification.

12 Claims, 2 Drawing Sheets

[Fig. 1]
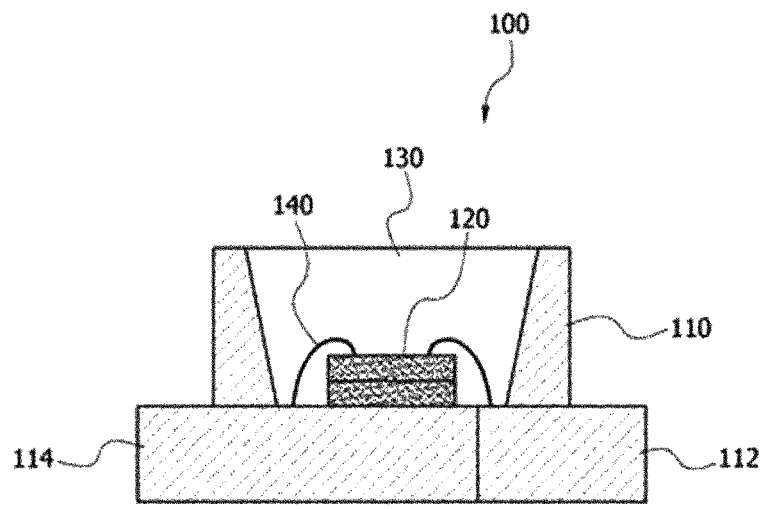
[Fig. 2]
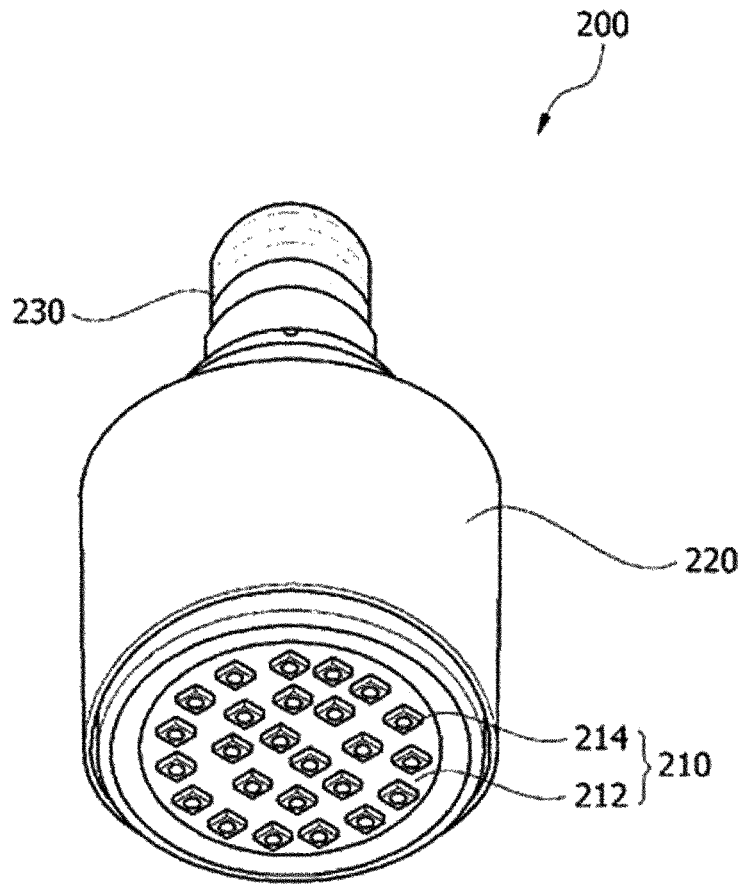

[Fig. 3]
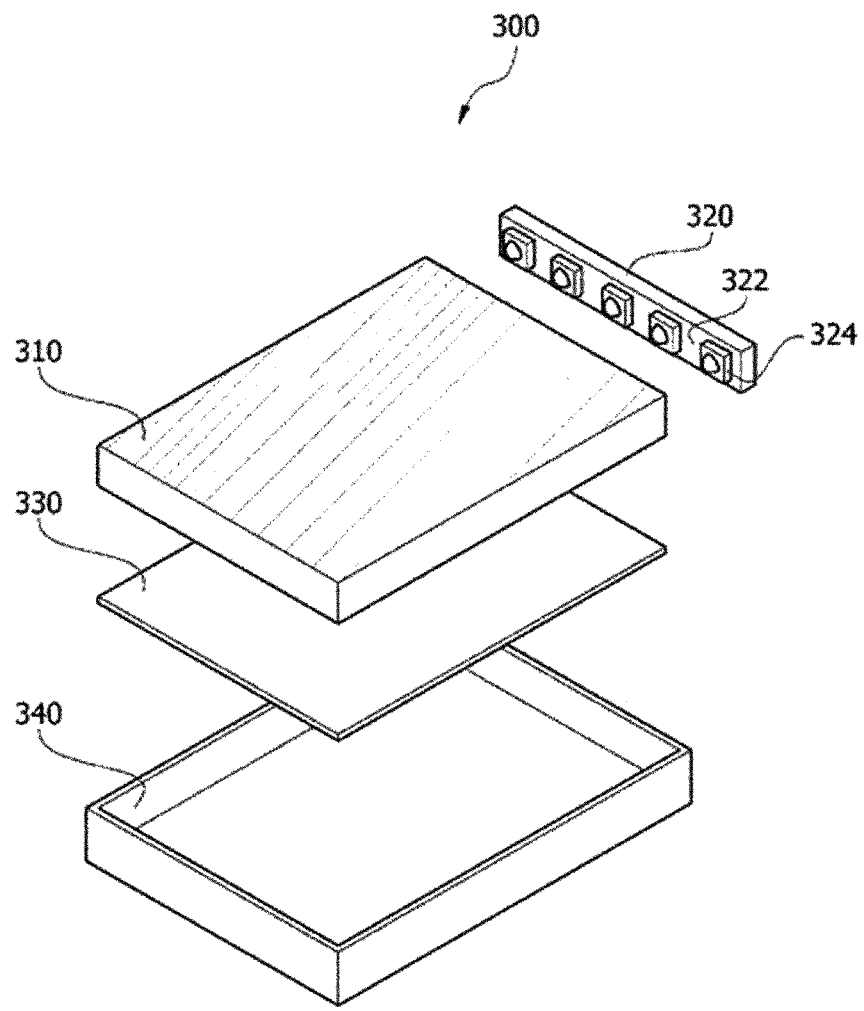

EPOXY RESIN COMPOSITION AND LIGHT-EMITTING APPARATUS USING THE SAME

CROSS-REFERENCE TO RELATED APPLICATIONS

This application is the U.S. national stage application of International Patent Application No. PCT/KR2014/001091, filed Feb. 10, 2014, which claims priority to Korean Application No. 10-2013-0015831, filed Feb. 14, 2013, the disclosures of each of which are incorporated herein by reference in their entirety.

TECHNICAL FIELD

The present invention relates to an epoxy resin composition and, more particularly to, an epoxy resin composition used for light-emitting apparatus.

BACKGROUND ART

A light-emitting apparatus that includes light-emitting elements such as light-emitting diodes (LEDs) is used as a light source for a variety of applications. The trend of the light-emitting elements towards higher output has been accelerated with the development of semiconductor technologies. Hence, there is a demand for resin compositions excellent in light resistance, heat resistance, and excess moisture tolerance in order to stably cope with a large quantity of light and heat.

For this purpose, an epoxy resin composition containing triazine derivatives is used. Such an epoxy resin composition is excellent in semi-solidification performance but cannot meet the required levels of the light resistance, heat resistance, and excess moisture tolerance. Particularly, the epoxy resin composition is vulnerable to yellowish discoloration and has poor shear adhesion to silicone and deterioration in the light transmission persistency rate over time, thereby adversely affecting the reliability of the light-emitting apparatus using it.

DISCLOSURE OF INVENTION

Technical Problem

It is therefore an object of the present invention to provide an epoxy resin composition and a light-emitting apparatus using the same.

Solution to Problem

In accordance with one embodiment of the present invention, there is provided an epoxy resin composition that includes: a triazine derivative epoxy compound; a siloxane compound including a cycloaliphatic epoxy group and a siloxane group; and a curing agent, where the epoxy resin composition includes 10 to 70 parts by weight of the siloxane group with respect to 100 parts by weight of the siloxane compound.

The triazine derivative epoxy compound includes an isocyanurate ring, and the siloxane compound is given by:

epoxycycloalkyl-$CH_2O$—$CO$-hydroxycycloalkyl-$OSiR^1R^2O$—$(SiR^3R^4O)n$-$SiR^5R^6O$-hydroxycycloalkyl-$CO$—$CH_2O$-epoxycycloalkyl Here, each of $R^1$ to $R^6$ is independently selected from the group consisting of H, Cl, Br, F, $C_1$-$C_3$ alkyl, $C_2$-$C_3$ alkene, and $C_2$-$C_3$ alkyne; and n is a positive integer, where the cycloalkyl group of the epoxycycloalkyl or the hydroxycycloalkyl is independently a cycloalkyl group having 5 to 20 carbon atoms.

The triazine derivative epoxy compound is triglycidylisocyanurate (TGIC), and the siloxane compound is given by:

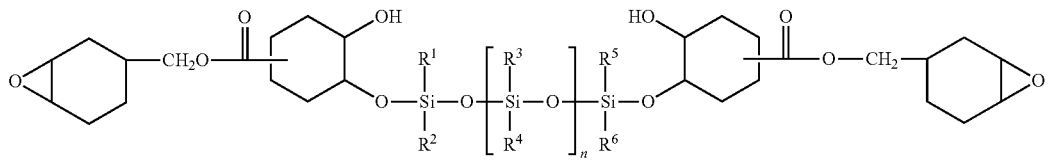

Here, each of $R^1$ to $R^6$ is independently selected from the group consisting of H, Cl, Br, F, $C_1$-$C_3$ alkyl, $C_2$-$C_3$ alkene, and $C_2$-$C_3$ alkyne; and n is a positive integer.

Each of $R^1$ to $R^6$ is independently a methyl group; and $2 \leq n \leq 8$.

The epoxy resin composition includes 5 to 50 parts by weight of the triazine derivative epoxy compound and the siloxane compound with respect to 100 parts by weight of the epoxy resin composition.

Further, the epoxy resin composition includes 10 to 60 parts by weight of the siloxane compound with respect to 100 parts by weight of the triazine derivative epoxy compound and the siloxane compound.

In accordance with another embodiment of the present invention, there is provided a light-emitting apparatus that includes: a molded body including a cured material; and a light-emitting element mounted on the molded body. The cured material includes an epoxy resin composition. The epoxy resin composition includes: a triazine derivative epoxy compound, a siloxane compound containing a cycloaliphatic epoxy group and a siloxane group, and a curing agent, where the epoxy resin composition includes 10 to 70 parts by weight of the siloxane group with respect to 100 parts by weight of the siloxane compound.

The molded body includes a dented portion including a bottom side and a lateral side. The light-emitting element is mounted on the bottom side of the dented portion and sealed with a sealing member.

Advantageous Effects of Invention

According to the embodiment of the present invention, it is possible to provide an epoxy resin composition that is excellent in light resistance, heat resistance, and excess moisture tolerance and capable of semi-solidification, with good shear adhesion to silicone. Therefore, the epoxy resin composition can prevent yellowish discoloration even after long-term exposure to excess heat or light and maintain heat resistance and light resistance, thereby providing a light-emitting apparatus with high efficiency.

BRIEF DESCRIPTION OF DRAWINGS

FIG. 1 illustrates a light-emitting apparatus according to one embodiment of the present invention.

FIG. 2 illustrates a lightening device including the light-emitting apparatus according to one embodiment of the present invention.

FIG. 3 illustrates a back light unit including the light-emitting apparatus according to one embodiment of the present invention.

BEST MODE FOR CARRYING OUT THE INVENTION

As the present invention allows for various changes and numerous embodiments, particular embodiments will be illustrated in the drawings and described in detail. However, the present invention is not limited to the specific embodiments and should be construed as including all the changes, equivalents, and substitutions included in the spirit and scope of the present invention.

Although ordinal numbers such as "first", "second", and so forth will be used to describe various components, those components are not limited by the terms. The terms are used only for distinguishing one component from another component. For example, a first component may be referred to as a second component and likewise, a second component may also be referred to as a first component, without departing from the teaching of the inventive concept. The term "and/or" used herein includes any and all combinations of one or more of the associated listed items.

The terminology used herein is for the purpose of describing an embodiment only and is not intended to be limiting of an exemplary embodiment. As used herein, the singular forms are intended to include the plural forms as well, unless the context clearly indicates otherwise. It will be further understood that the terms "comprises" and/or "has" when used in this specification, specify the presence of stated feature, number, step, operation, component, element, or a combination thereof but do not preclude the presence or addition of one or more other features, numbers, steps, operations, components, elements, or combinations thereof.

The terms used herein, including technical and scientific terms, have the same meanings as terms that are generally understood by those skilled in the art, as long as the terms are differently defined. It should be understood that terms defined in a generally used dictionary have meanings coinciding with those of terms in the related technology. As long as the terms are not defined obviously, they are not ideally or excessively analyzed as formal meanings.

It will also be understood that when an element such as a layer, film, region, panel, or the like is referred to as being "on" another element, it can be "directly on" the other element or intervening elements may also be present. In contrast, when an element is referred to as being "directly on" another element, there are no intervening elements present.

Hereinafter, a detailed description will be given as to the embodiments of the present invention with reference to the accompanying drawings, in which the same or similar components are denoted by the same reference numerals throughout the different drawings and not described over again.

Throughout the specification, the unit "wt %" is exchangeable with "part by weight".

The epoxy resin composition according to one embodiment of the present invention includes an epoxy compound and a curing agent. In this regard, the epoxy compound includes a triazine derivative epoxy compound and a siloxane compound including a cycloaliphatic epoxy group and a siloxane group. With respect to 10 parts by weight of the epoxy compound, the epoxy resin composition may include the curing agent in an amount of 1 to 100 parts by weight, preferably 3 to 50 parts by weight, more preferably 5 to 15 parts by weight. When the curing agent is included in an amount of 1 to 100 parts by weight with respect to 10 parts by weight of the epoxy compound, the epoxy resin composition may improve in light resistance, heat resistance, excess moisture tolerance, and curability. And, the siloxane compound includes the siloxane group 10 wt % to 70 wt %.

The epoxy resin composition according to one embodiment of the present invention may include the epoxy compound 5 wt % to 50 wt % with respect to the total weight of the epoxy resin composition. In this regard, the epoxy compound includes a triazine derivative epoxy compound, and a siloxane compound including a cycloaliphatic epoxy group and a siloxane group (hereinafter, referred to as "siloxane compound"). The content of the epoxy compound less than 5 wt % with respect to the total weight of the epoxy resin composition leads to deterioration in light resistance, heat resistance, and excess moisture tolerance. The content of the epoxy compound greater than 50 wt % with respect to the total weight of the epoxy resin composition results in poor curability.

In this regard, the siloxane compound may be included in an amount of 10 wt % to 60 wt % with respect to the total weight of the epoxy compound. The content of the siloxane compound less than 10 wt % with respect to the total weight of the epoxy compound deteriorates the shear adhesion to the silicone filler included in the light-emitting element. The content of the siloxane compound greater than 60 wt % with respect to the total weight of the epoxy compound may provide excellences in heat resistance and excess moisture tolerance, but with difficulty of semi-solidification.

In this regard, the triazine derivative epoxy compound may include an isocyanurate ring. The epoxy compound including an isocyanurate ring is excellent in light resistance and electrical insulation. The triazine derivative epoxy compound may be, for example, triglycidylisocyanurate (TGIC) as represented by the following formula 1:

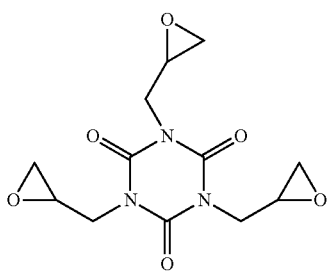
[Formula 1]

The siloxane compound may be represented by the following formula 2:

[Formula 2]
Epoxycycloalkyl-CH$_2$O—CO-hydroxycycloalkyl-OSiR$^1$R$^2$O—(SiR$^3$R$^4$O)$n$-SiR$^5$R$^6$O-hydroxycycloalkyl-CO—CH$_2$O-epoxycycloalkyl Here, each of R$^1$ to R$^6$ is independently selected from the group consisting of H, Cl, Br, F, C$_1$-C$_3$ alkyl, C$_2$-C$_3$ alkene, and C$_2$-C$_3$ alkyne; and n is a positive integer. In this regard, each of the four cycloalkyl groups may be independently a cycloalkyl group having 5 to 20 carbon atoms. Throughout the specification, the epoxycycloalkyl group may mean a cycloaliphatic epoxy group.

The siloxane compound may also be represented by the following formula 3:

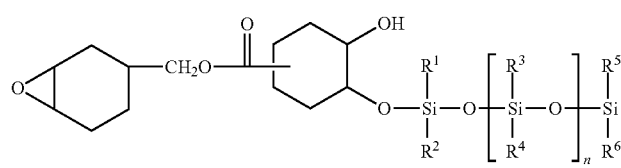
[Formula 3]

Here, each of R$^1$ to R$^6$ is independently selected from the group consisting of H, Cl, Br, F, C$_1$-C$_3$ alkyl, C$_2$-C$_3$ alkene, and C$_2$-C$_3$ alkyne. And, n may be designated to satisfy the condition that the content of the following formula 4 is 10 wt % to 70 wt %, preferably 30 wt % to 60 wt %, more preferably 35 wt % to 55 wt % with respect to the content of the formula 3. Throughout the specification, the formula 4 may be referred to as "siloxane group".

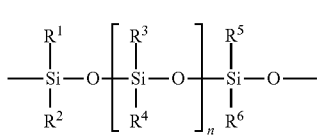
[Formula 4]

The content of the siloxane compound of the formula 4 less than 10 wt % of the siloxane compound of the formula 3 may lead to deterioration in the shear adhesion to the silicone filler included in the light-emitting element. The content of the siloxane compound of the formula 4 greater than 70 wt % of the siloxane compound of the formula 3 may result in difficulty of semi-solidification. If each of R$^1$ to R$^6$ is a methyl group, n may be a positive integer in the range of 1 to 16, preferably 2 to 8, more preferably 2 to 6, most preferably 3 to 5. Even if none of R$^1$ to R$^6$ is a methyl group, n may be differently given so that the siloxane group of the formula 4 is included in an amount of 10 wt % to 70 wt % with respect to 100 wt % of the siloxane compound of the formula 3.

The epoxy resin composition according to one embodiment of the present invention may further include another epoxy compound. For example, the epoxy resin composition may further include at least one selected from bisphenol A epoxy resin, bisphenol F epoxy resin, biphenol epoxy resins (e.g., 3,3',5,5' tetramethyl-4,4'-biphenol epoxy resin, or 4,4'-biphenol epoxy resin), phenol novolac epoxy resin, cresol novolac epoxy resin, bisphenol A novolac epoxy resin, naphthalenediol epoxy resin, trisphenylolmethane epoxy resin, tetrakisphenylolethane epoxy resin, and an epoxy resin obtained by hydrogenating the aromatic ring of a phenoldicyclopentadiene novolac epoxy resin.

The epoxy resin composition according to one embodiment of the present invention may include a curing agent. The curing agent may be included in an amount of 5 wt % to 50 wt % with respect to the total weight of the epoxy resin composition. The content of the curing agent less than 5 wt % with respect to the total weight of the epoxy resin composition leads to curing defects and deterioration in reliability. The content of the curing agent greater than 50 wt % with respect to the total weight of the epoxy resin composition ends up deteriorating the excess moisture tolerance due to the unreacted curing agent.

The curing agent included in the epoxy resin composition may be an acid anhydride-based curing agent.

Examples of the acid anhydride-based curing agent may include any one selected from dodecenyl succinic anhydride, polyadipic acid anhydride, polyazelaic acid anhydride, polysebasic acid anhydride, poly(ethyl octadecanoic acid) anhydride, poly(phenyl hexadecanoic acid) anhydride, methyl tetrahydrophthalic acid anhydride, methyl hexahydrophthalic acid anhydride, hexahydrophthalic anhydride, anhydrous methyl hymic acid, tetrahydrophthalic anhydride, trialkyltetrahydrophthalic anhydride, methyl cyclohexene dicarbonic acid anhydride, methyl cyclohexene tetracarbonic acid anhydride, phthalic anhydride, anhydrous trimellitic acid, anhydrous pyromellitic acid, benzophenone tetracarbonic acid anhydride, ethylene glycol bistrimellitate, hetic anhydride, nadic anhydride, anhydrous methyl nadic acid, 5-(2,5-dioxotetrahydro-3-furanyl)-3-methyl-3-cyclohexane-1,2-dicarbonic acid anhydride, 3,4-dicarboxy-1,2,3,4-tetrahydro-1-naphthalene succinic acid dianhydride, 1-methyl-dicarboxy-1,2,3,4-tetrahydro-1-naphthalene succinic acid dianhydride, and mixtures thereof.

The epoxy resin composition may further include a curing accelerator. The curing accelerator may be included in an amount of 0.1 wt % to 2 wt % with respect to the total weight of the epoxy resin composition. Examples of the curing accelerator may include any one selected from tertiary amines, imidazoles, organic carboxylates thereof, metal salts of organic carboxylic acid, metal-organic chelate compounds, aromatic sulfonium salts, organic phosphine compounds, salts thereof, phosphor-based curing accelerators (e.g., 2-ethyl-4-methylimidazole, methyl-tributylphosphonium-dimethylphosphate, tertiary phosphonium bromide, etc.) and mixtures thereof.

The epoxy resin composition may include 0.1 wt % to 10 wt % of an additive. Examples of the additive may include a dispersing agent, a leveling agent, an antioxidant, and so forth. Examples of the antioxidant may include at least one selected from phenol-based antioxidants, phosphor-based antioxidants, sulfur-based antioxidants.

Examples of the phenol-based antioxidants may include 2,6-di-t-butyl-p-cresol, butylated hydroxyanisol, 2,6-di-t-butyl-p-ethylphenol, stearyl-β(3,5-di-t-butyl-4-hydroxyphenyl)propionate, 2,2'-methylenebis(4-methyl-6-t-butylphenol), 4,4'-butyllidenebis(3-methyl-6-t-butylphenol), 3,9-bis[1,1-dimethyl-2-{β-(3-t-butyl-4-hydroxy-5-methylphenyl)propionyloxy}ethyl]2,4,8,10-tetraoxyspiro[5,5]undecane, 1,1,3-tris(2-methyl-4-hydroxy-5-t-butylphenyl)butane, 1,3,5-trimethyl-2,4,6-tris(3,5-di-t-butyl-4-hydroxybenzyl)benzene, etc.

Examples of the phosphor-based antioxidants may include phosphorous acid triphenyl, phosphorous acid diphenylalkyl, phosphorous acid phenyldialkyl, phosphorous acid tri(nonylphenyl), phosphorous acid trilauryl, phosphorous acid trioctadecyl, distearylpentaerythritol diphosphite, tris(2,4-di-tert-butylphenyl)phosphite, diisodecylpentaerythritol diphosphite, di(2,4-di-tert-butylphenyl)pentaerythritol diphosphite, tristearyl sorbitol triphosphate, tetrakis(2,4-di-tert-butylphenyl)-4,4'-biphenyl diphosphite, etc.

Examples of the sulfur-based antioxidants may include dilauryl-3,3'-thiodipropionate, dimiristyl-3,3'-thiodipropionate, distearyl-3,3'-thiodipropionate, etc.

These antioxidants may be used alone or in mixtures thereof.

The epoxy resin composition may include a release agent 0.1 wt % to 10 wt %. The release agent can improve a release after molding the epoxy resin composition. Examples of the release agent may include any one selected from ester waxes (e.g., carnauba wax, montanic acid, stearic acid, higher fatty acids, higher fatty acid metal salts, montanic acid ester, etc.), polyethylene waxes, polyolefin waxes, and mixtures thereof.

The epoxy resin composition according to one embodiment of the present invention may be applied to a light-emitting apparatus. For example, the epoxy resin composition according to one embodiment of the present invention can be used to form, mold or seal a light-emitting apparatus.

FIG. 1 shows a light-emitting apparatus according to one embodiment of the present invention.

Referring to FIG. 1, a light-emitting apparatus 100 includes a molded body 110 formed from a cured material including the epoxy resin composition according to one embodiment of the present invention; and a light-emitting element 120 mounted on the molded body 110.

The molded body 110 includes a dented portion composed of a bottom side and a lateral side. The light-emitting element 120 is mounted on the bottom side of the dented portion and sealed with a sealing member 130.

The light-emitting element 120 has a pair of electrodes, positive and negative. The positive and negative electrodes are connected to leads 112 and 114 via a wire 140, respectively. The sealing member 130 may include at least either one of a triazine derivative epoxy compound or a siloxane compound.

Throughout the specification, the light-emitting apparatus may be exchangeably used with a light-emitting element package.

The light-emitting apparatus according to one embodiment of the present invention may be applied to various applications, such as lightening equipment, back light unit (BLU) for display devices, UHD (Ultra High Definition) TVs, laptop computers, tablet PCs, cameras, mobile phones, etc.

FIG. 2 illustrates a lightening device including the light-emitting apparatus according to one embodiment of the present invention.

Referring to FIG. 2, a lightening device 200 includes a light-emitting module 210, a case 220, and a connector terminal 230.

The light-emitting module 210 is held in the case 220. The connector terminal 230 is connected to the case 220 to supply power from an external power source (not shown) for the light-emitting module 210. Although it is illustrated that the connector terminal 230 is connected to the external power source using a socket, this is not intended to limit the present invention.

The light-emitting module 210 includes a substrate 212 and at least one light-emitting element package 214. The at least one light-emitting element package 214 is mounted on the substrate 212. The light-emitting element package 214 may include a light-emitting element and a molded body that includes the epoxy resin composition according to one embodiment of the present invention.

FIG. 3 illustrates a back light unit including the light-emitting apparatus according to one embodiment of the present invention.

Referring to FIG. 3, a back light unit 300 includes a light guiding panel 310, a light-emitting module 320, a reflecting member 330, and a bottom cover 340.

The light guiding panel 310 diffuses light to form a surface light source. The light-emitting module 320, which is a light source of the display device in which the back light unit is to be installed, provides light for the light guiding panel 310. The light-emitting module 320 includes a substrate 322 and at least one light-emitting element package 324. The light-emitting element package 324 may be mounted on the substrate 322. The light-emitting element package 324 may include a light-emitting element and a molded body that includes the epoxy resin composition according to one embodiment of the present invention.

The reflecting member 330 is formed under the light guiding panel 310 to reflect the incident light on the bottom side of the light guiding panel 310 so that the light face upwards to enhance the brightness of the back light unit.

The bottom cover 340 holds the light guiding panel 310, the light-emitting module 320, and the reflecting member 330. For this purpose, the bottom cover 340 may be in the form of an upside-open box, which is not given to limit the present invention.

Hereinafter, the present invention will be described in further detail with reference to Examples and Comparative Examples.

EXAMPLE 1

A mixture is made from the epoxy compound of the formula 1 30 wt %, the epoxy compound of the formula 3 20 wt %(where each of $R^1$ to $R^6$ is independently a methyl group; and n is 1 as given to satisfy that the silicone compound of the formula 4 is 10 wt % of the epoxy compound of the formula 3), a curing agent 47 wt %, a curing accelerator 1 wt %, an additive 1 wt %, and a release agent 1 wt % and then subjected to heat treatment to obtain the final product of Example 1.

EXAMPLE 2

A mixture is made from the epoxy compound of the formula 1 30 wt %, the epoxy compound of the formula 3 20 wt %(where each of $R^1$ to $R^6$ is independently a methyl group; and n is 2 as given to satisfy that the silicone compound of the formula 4 is 30 wt % of the epoxy compound of the formula 3), a curing agent 47 wt %, a curing accelerator 1 wt %, an additive 1 wt %, and a release agent 1 wt % and then subjected to heat treatment to obtain the final product of Example 2.

EXAMPLE 3

A mixture is made from the epoxy compound of the formula 1 30 wt %, the epoxy compound of the formula 3 20 wt %(where each of $R^1$ to $R^6$ is independently a methyl group; and n is 5 as given to satisfy that the silicone compound of the formula 4 is 50 wt % of the epoxy compound of the formula 3), a curing agent 47 wt %, a curing accelerator 1 wt %, an additive 1 wt %, and a release agent 1 wt % and then subjected to heat treatment to obtain the final product of Example 3.

EXAMPLE 4

A mixture is made from the epoxy compound of the formula 1 30 wt %, the epoxy compound of the formula 3 20 wt %(where each of $R^1$ to $R^6$ is independently a methyl group; and n is 14 as given to satisfy that the silicone compound of the formula 4 is 70 wt % of the epoxy compound of the formula 3), a curing agent 47 wt %, a curing accelerator 1 wt %, an additive 1 wt %, and a release agent 1 wt % and then subjected to heat treatment to obtain the final product of Example 4.

COMPARATIVE EXAMPLE 1

A mixture is made from the epoxy compound of the formula 1 50 wt %, a curing agent 47 wt %, a curing accelerator 1 wt %, an additive 1 wt %, and a release agent 1 wt % and then subjected to heat treatment to obtain the final product of Comparative Example 1.

COMPARATIVE EXAMPLE 2

A mixture is made from the epoxy compound of the formula 3 50 wt %(where each of $R^1$ to $R^6$ is independently a methyl group; and n is 5 as given to satisfy that the silicone compound of the formula 4 is 50 wt % of the epoxy compound of the formula 3), a curing agent 47 wt %, a curing accelerator and an additive 2 wt %, and a release agent 1 wt % and then subjected to heat treatment to obtain the final product of Comparative Example 2.

Each of the final products of Examples 1 to 4 and Comparative Examples 1 and 2 is molded and cured on a silicone and then measured in regards to the shear adhesion to the silicone. Further, each of the final products of Examples 1 to 4 and Comparative Examples 1 and 2 is exposed to a light having a wavelength of 450 nm to measure the initial light transmission. Finally, each of the final products of Examples 1 to 4 and Comparative Examples 1 and 2 is exposed to a light having a wavelength of 450 nm at 175° C. for 24 hours to measure the light transmission persistency rate. The measurement results are presented in Table 1.

TABLE 1

| Test No. | Shear adhesion | Initial light transmission | Light transmission persistency rate |
| --- | --- | --- | --- |
| Example 1 | Δ | 91% | 92% |
| Example 2 | Δ | 92% | 92% |
| Example 3 | ○ | 92% | 94% |
| Example 4 | ○ | 91% | 90% |
| Comparative Example 1 | X | 90% | 90% |
| Comparative Example 2 | ○ | 93% | 89% |

Referring to Table 1, the epoxy resin composition including a triazine derivative epoxy compound alone, as Comparative Example 1, has poor shear adhesion to silicone and low levels of the initial light transmission and the light transmission persistency rate that are 90% or less. Further, the epoxy resin composition including a siloxane compound alone, as Comparative Example 2, has good shear adhesion to silicone and good initial light transmission, but with low light transmission persistency rate of 90% or less.

Contrarily, the epoxy resin compositions including both the triazine derivative epoxy compound and the siloxane compound of the formula 3, as Examples 1 to 4, are all excellent in shear adhesion to silicone, initial light transmission, and light transmission persistency rate. In particular, in the case of the composition of Example 3, that is, when including both the triazine derivative epoxy compound and the siloxane compound of the formula 3 and the siloxane compound of the formula 3 contains about 50 wt % of the siloxane group, the epoxy resin composition can be most excellent in shear adhesion to silicone, initial light transmission, and light transmission persistency rate.

While the present invention has been particularly illustrated and described with reference to preferred embodiments thereof, various modifications or changes can be made without departing from the scope of the present invention.

100: Light-emitting apparatus
110: Molded body
120: Light-emitting
130: Sealing member

The invention claimed is:

1. An epoxy resin composition comprising:
   a triazine derivative epoxy compound;
   a siloxane compound comprising a cycloaliphatic epoxy group and a siloxane group; and
   a curing agent,
   the siloxane compound being represented by the following formula:
   epoxycycloalkyl-$CH_2O$—CO-hydroxycycloalkyl-$OSiR^1R^2O$—$(SiR^3R^4O)_n$—$SiR^5R^6O$-hydroxycycloalkyl-CO—$CH_2O$-epoxycycloalkyl,
   wherein each of $R^1$ to $R^6$ is independently selected from the group consisting of H, Cl, Br, F, C1-C3 alkyl, C2-C3 alkene, and C2-C3 alkyne; and n is a positive integer, and
   wherein the hydroxycycloalkyl group comprises a cycloalkyl group having 5 to 20 carbon atoms.

2. The epoxy resin composition as claimed in claim 1, wherein the triazine derivative epoxy compound comprises an isocyanurate ring.

3. The epoxy resin composition as claimed in claim 2, wherein the triazine derivative epoxy compound comprises triglycidylisocyanurate (TGIC).

4. The epoxy resin composition as claimed in claim 1, wherein the cycloaliphatic epoxy group is the epoxycycloalkyl group comprising a cycloalkyl group having 5 to 20 carbon atoms.

5. The epoxy resin composition as claimed in claim 1, wherein the siloxane compound is represented by the following formula:

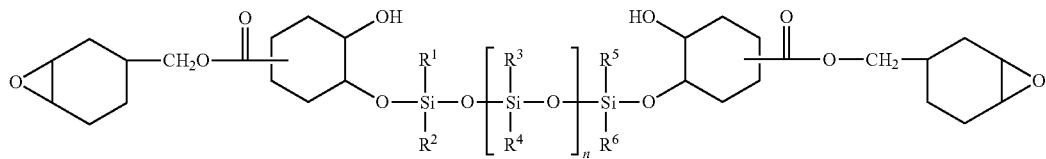

wherein each of R1 to R6 is independently selected from the group consisting of H, Cl, Br, F, C1-C3 alkyl, C2-C3 alkene, and C2-C3 alkyne; and n is a positive integer.

6. The epoxy resin composition as claimed in claim 5, wherein each of R1 to R6 is independently a methyl group; and $1 \leq n \leq 16$.

7. The epoxy resin composition as claimed in claim 6, wherein each of R1 to R6 is independently a methyl group; and $2 \leq n \leq 8$.

8. The epoxy resin composition as claimed in claim 7, wherein each of R1 to R6 is independently a methyl group; and $3 \leq n \leq 5$.

9. The epoxy resin composition as claimed in claim 1, wherein the curing agent comprises an acid anhydride-based curing agent.

10. A light-emitting apparatus comprising:
a molded body comprising a cured material; and
a light-emitting element mounted on the molded body,
wherein the cured material comprises an epoxy resin composition,
the epoxy resin composition comprising: a triazine derivative epoxy compound; a siloxane compound containing a cycloaliphatic epoxy group and a siloxane group; and a curing agent,
the siloxane compound being represented by the following formula:
epoxycycloalkyl-$CH_2O$—CO-hydroxycycloalkyl-$OSiR^1R^2O$—$(SiR^3R^4O)_n$—$SiR^5R^6O$-hydroxycycloalkyl-CO—$CH_2O$-epoxycycloalkyl,
wherein each of $R^1$ to $R^6$ is independently selected from the group consisting of H, Cl, Br, F, C1-C3 alkyl, C2-C3 alkene, and C2-C3 alkyne; and n is a positive integer, and
wherein the hydroxycycloalkyl group comprises a cycloalkyl group having 5 to 20 carbon atoms.

11. The light-emitting apparatus as claimed in claim 10, wherein the molded body comprises a dented portion comprising a bottom side and a lateral side,
wherein the light-emitting element is mounted on the bottom side of the dented portion and sealed with a sealing member.

12. The light-emitting apparatus as claimed in claim 11, wherein the sealing member comprises at least one of the triazine derivative epoxy compound and the siloxane compound.

* * * * *